(12) United States Patent
Cortright et al.

(10) Patent No.: US 7,548,081 B1
(45) Date of Patent: Jun. 16, 2009

(54) SYSTEM AND METHOD FOR CONTROLLING ENVIRONMENTAL PARAMETERS OF A DEVICE UNDER TEST

(75) Inventors: Sean P. Cortright, Santa Rosa, CA (US); David Henderson, Santa Rosa, CA (US); Calvin Krug, Santa Rosa, CA (US); Ryan Kelley, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 78 days.

(21) Appl. No.: 11/888,036

(22) Filed: Jul. 31, 2007

(51) Int. Cl.
*G01R 31/26* (2006.01)
(52) U.S. Cl. ...................... 324/760; 324/765
(58) Field of Classification Search .................. None
See application file for complete search history.

(56) References Cited

U.S. PATENT DOCUMENTS

RE35,716 E * 1/1998 Stapleton et al. ............... 435/3
6,660,228 B1 * 12/2003 Chang et al. ............... 422/68.1

\* cited by examiner

*Primary Examiner*—Minh N Tang

(57) ABSTRACT

The present invention is directed to a system and method to seal a device under test (DUT) into a portable chamber wherein the magnitude of the temperature, either up or down, is maintained by continuously providing a control signal applied to heating or cooling elements. In one embodiment, voltage polarity is used to select between heat and cold and voltage magnitude is used to control temperature. In one embodiment, several parameters within the chamber are monitored and the resultant signals are then used to define the magnitude and polarity of the control voltage. In one embodiment, a controller is used to receive information pertaining to the DUT. This information, for example, includes the identity of the DUT as well as its stabilization time and set temperature. The set temperature may be adjusted according to historical data pertaining to the DUT to compensate for differences over other test methods.

6 Claims, 5 Drawing Sheets

SYSTEM AND METHOD FOR CONTROLLING ENVIRONMENTAL PARAMETERS OF A DEVICE UNDER TEST

TECHNICAL FIELD

This disclosure relates to the control of environmental parameters associated with a device during operational testing and more specifically to systems and methods for controlling the temperature environment of a device under test (DUT).

BACKGROUND OF THE INVENTION

Testing of electronic devices is a complex undertaking, made even more so by the wide and ever changing nature of the tests that need to be performed on sophisticated electronic devices. Each device has different test requirements and different connection opportunities depending upon accessible connection points. Also, during the testing routine it is often necessary to monitor the device's performance at a temperature other than ambient. This then requires the operating temperature of the DUT to be raised (or lowered) to a certain point for a certain time.

Typically, in the past, in order to perform such environmental testing on a device a heating or cooling chamber was used. Several problems are inherent with such a testing scenario in that it is difficult and expensive to establish proper connections to the device while the device is sealed in such a chamber. This problem is compounded when the device changes and new connections are required.

In addition, heat (or cooling) chambers tend to cycle around a desired temperature and thus swing through cycles of underheating and overheating the device. Thus, a hysteresis loop effect occurs with respect to the environmental testing which then reduces the accuracy of the resulting tests.

BRIEF SUMMARY OF THE INVENTION

The present invention is directed to a system and method to seal a device under test (DUT) into a portable chamber wherein the magnitude of the temperature, either up or down, is maintained by continuously providing a control signal applied to heating or cooling elements. In one embodiment, voltage polarity is used to select between heat and cold and voltage magnitude is used to control temperature. In one embodiment, several parameters within the chamber are monitored and the resultant signals are then used to define the magnitude and polarity of the control voltage.

In one embodiment, a controller is used to receive information pertaining to the DUT. This information, for example, includes the identity of the DUT as well as its stabilization time and set temperature. The set temperature may be adjusted according to historical data pertaining to the DUT to compensate for differences over other test methods.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
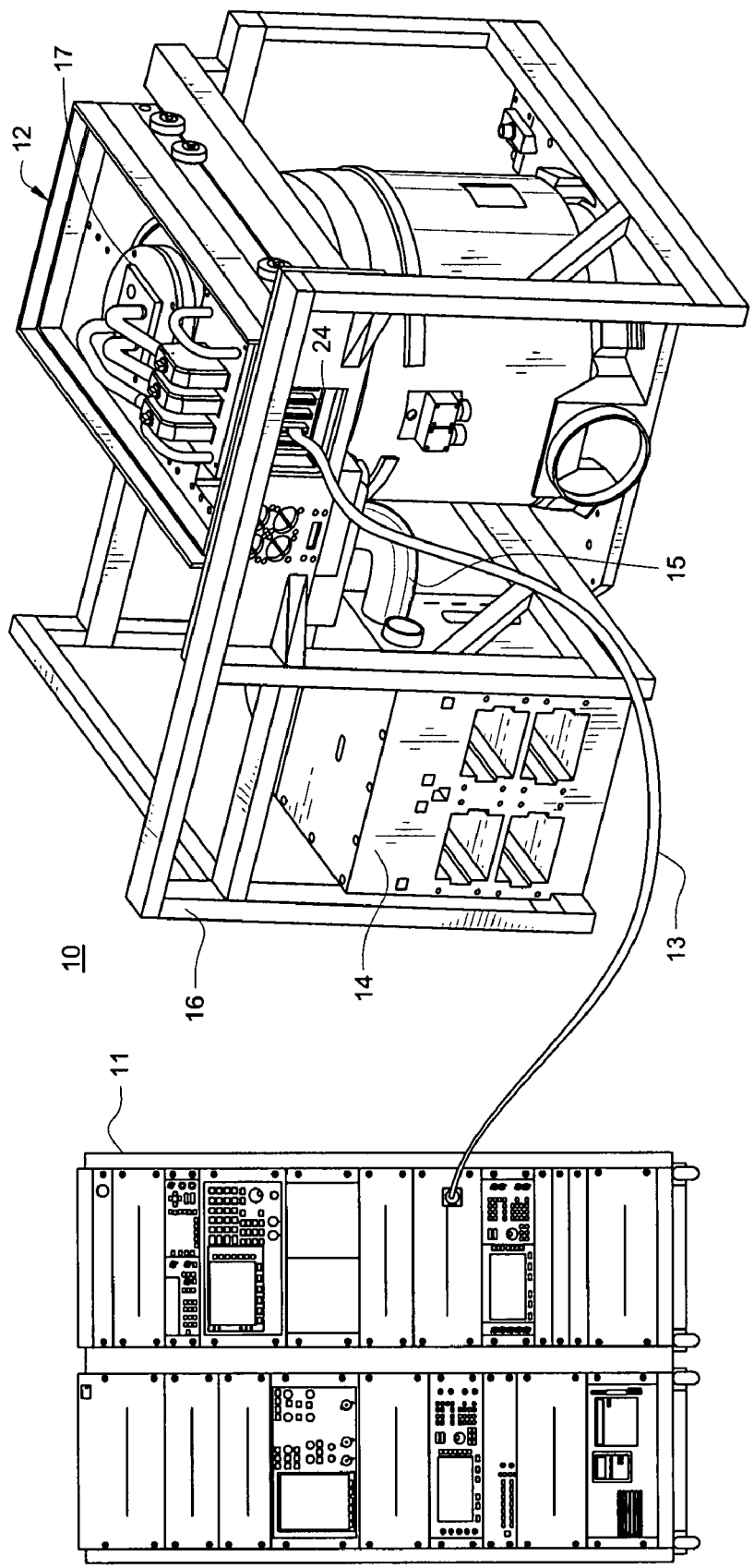
FIG. 1 shows one embodiment of a test system using the concepts of the invention.

FIG. 1 shows one embodiment 10 of a test system using the concepts of the invention to perform operational testing on a device under test (DUT), such as DUT 17. In the embodiment shown, test facility 11 is connected to a single test tray 12 via cable 13. Test tray 12, as will be seen in FIG. 2, can be sealed separately from test housing 16 and from temperature control device 14, which sends treated air to tray 12 via, for example, duct 15. In alternate embodiments any number of test positions (trays) can be tested, either concurrently or separately. Note also that the concepts discussed herein can be used in an automatic system when the test sequences, test parameters and even the connections to the DUT, are dependent upon DUT "personality" data maintained in association with the DUT, or in a manual system.

Figure 2:
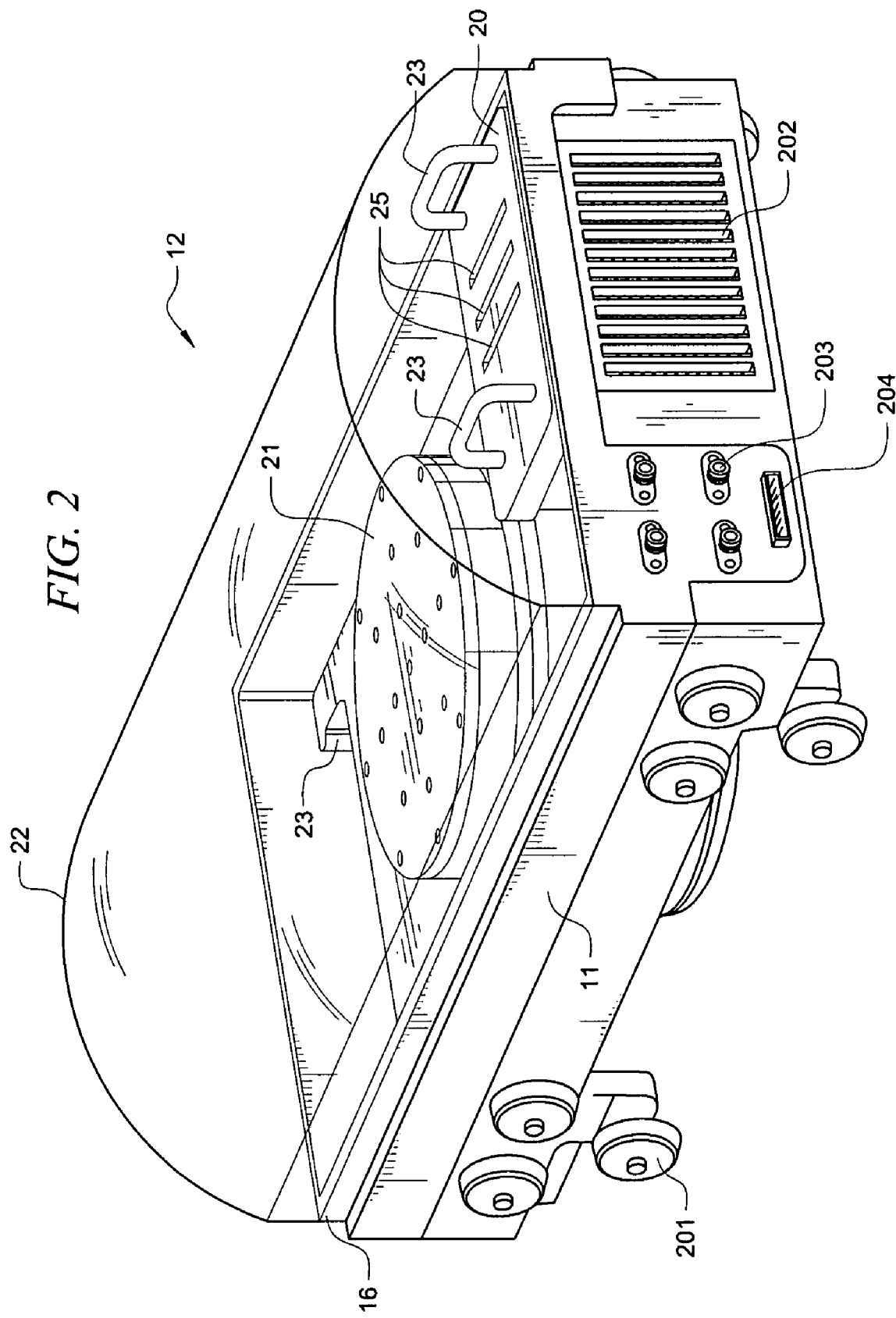
FIG. 2 shows one test position having a thermal cover expanded around the DUT.

FIG. 2 shows one embodiment of a portable test tray, such as tray 12, having DUT support platform 21. The DUT (not shown) would be sealed within expandable enclosure 22, which in one embodiment could be neoprene. Tray 12 has duct 23 for allowing treated (heated or cooled or otherwise modified) to enter the test chamber from environment control air treatment device 14. In one embodiment, the tray has wheels 201 to allow the tray to be moved. Connectors 202, 203, 204 serve to connect the tray and thus the DUT to the test system. The supply and return ventilation duct built into the bottom of the tray (not shown) mates with stationary ducting in the space below the tray when the tray is positioned at an environmental test position. The ducting includes inflatable gaskets which are inflated when the system starts up, completing the seal. The chamber is pressurized slightly during operation to fully inflate the neoprene bag around the DUT and to provide a continuous source of dry air to prevent condensation.

In some embodiments, environmental control device 14 can be on the cart with the DUT while in other embodiments, the environmental control device 14 is in a fixed position (such as, for example, as shown in FIG. 1) of an automatic or manual test system.

Figure 3:
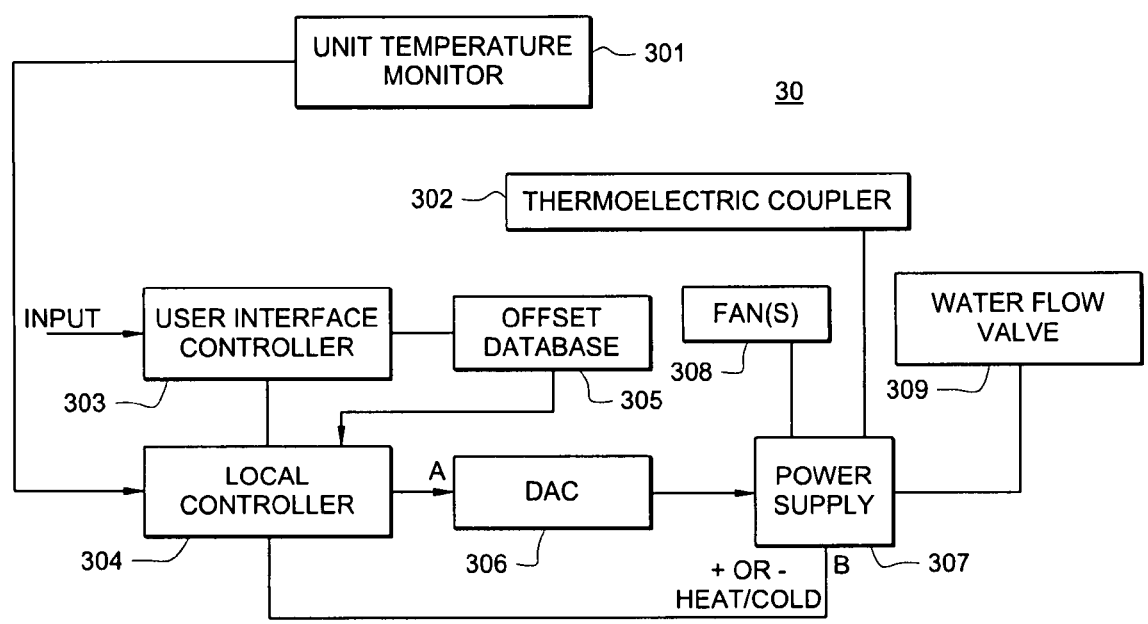
FIG. 3 shows one embodiment of a system for controlling environmental temperatures for a DUT in accordance with the teachings of the invention.

FIG. 3 shows one embodiment 30 of a system for controlling environmental temperatures for a DUT in accordance with the teachings of the invention. In system 30, unit temperature monitor 301 monitors the temperature of the DUT at one or more places either on the device or within the sealed space around the DUT and provides the actual temperature data to local controller 304 which, in one embodiment, can be a programmable logic controller (PLC). User interface 303 provides an interface to a user so that the user can establish, or manually, or automatically, for example by a personality module associated with the DUT. Controller 303 provides a programmatic interface to PLC 304 which, in turn, interfaces with system hardware for controlling the temperature of the DUT.

The actual testing (environmental) temperature of the DUT is controlled, in one embodiment, by thermoelectric coupler 302 which can be a Peltier device. Thermoelectric couples of this type are solid-state devices capable of converting electrical energy into a temperature gradient, known as the Peltier effect. A typical thermoelectric module is composed of two ceramic substrates that serve as a housing and electrical insulation for P-type and N-type (typically Bismuth Telluride) elements between the substrates. Heat is absorbed at the cold junction by electrons as they pass from a low energy level in the P-type element, to a higher energy level in the N-type element. At the hot junction, energy is expelled to a thermal sink as electrons move from a high energy element to a lower energy element. A module contains several P-N couples that are connected electrically in series and thermally in parallel. Many such devices can be used as desired.

Water flow past the coupler is maintained and controlled by valve 308 under control of power supply 307 and controller 304. In this embodiment, digital to analog (DAC) controller 306 controls power supply 307, at least to the extent that voltage levels (lead A) and polarity (lead B) are supplied to coupler 302 from the power supply. DAC 306 is controlled by controller 304. Fan(s) are also controlled by power supply 307 in conjunction with controller 304.

Figure 4:
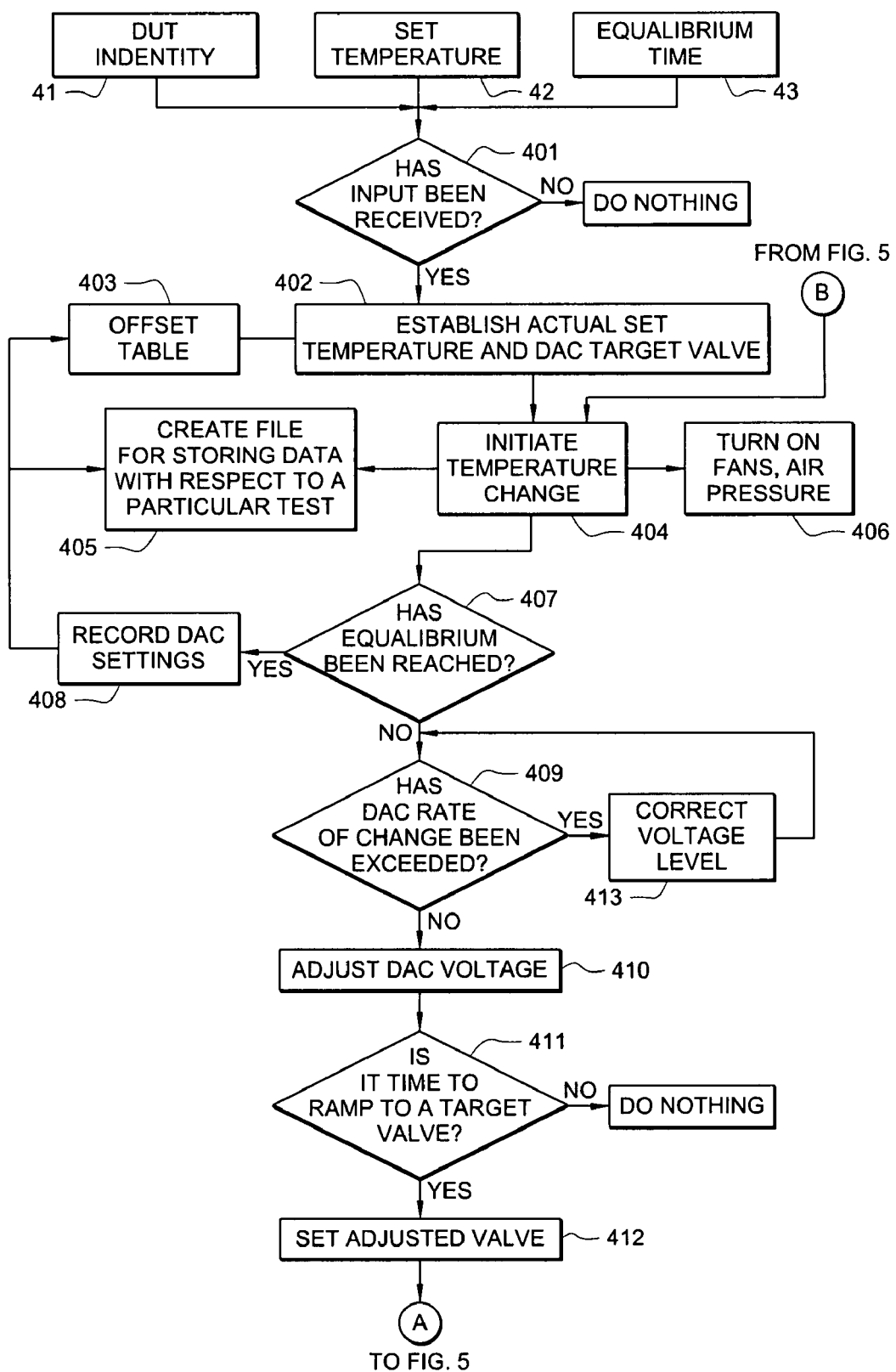
FIGS. 4 and 5 show an embodiment of methods for controlling environmental temperatures for a DUT in accordance with the teachings of the invention.
Figure 5:
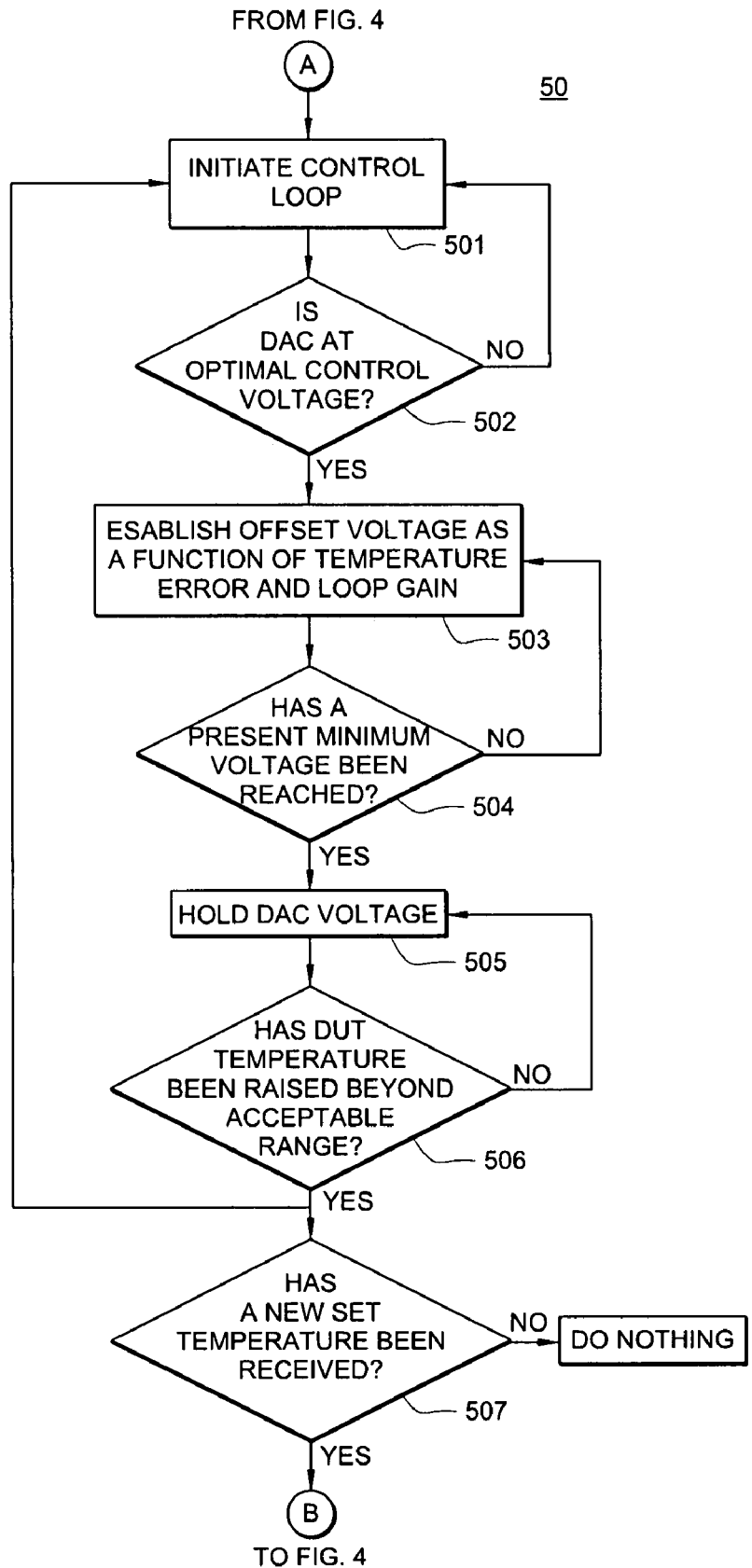

FIGS. 4 and 5 show an embodiment 40 of methods for controlling environmental temperatures for a DUT in accordance with the teachings of the invention. User interface 303 (FIG. 3) interacts with local controller 304 to provide control of the temperature for testing. In the embodiment being discussed, once the parameters for tests are received by controller 303, the system may run autonomously by ramping to the set temperature, stabilizing and equilibrating without further external input.

From an idle state, temperature control is initiated, as shown by method 40 (FIG. 4). Three test data items 41, 42 and 43 are provided by a user or by a personality module or otherwise to the system pertaining to the DUT. These items are the identity of the DUT which can be the model number of the DUT, the set temperature (42), and the equilibration time (43). Note that any number of different inputs can be received, if desired.

When process 401 determines that the new parameters have been received, process 402 begins to setup the system for environmental testing. The equilibration time is passed to controller 304 without modification. Controller 303 uses the model number and nominal set temperature to determine the actual set temperature that needs to be established using offset table 403 located, for example, in database 305 (FIG. 3). The actual set temperature is determined by looking up the model in the user-maintained set temperature offset table and interpolating (if needed) to determine the offset value to apply to the received set temperature number. This offset table lookup ensures that the DUT's internal temperature after equilibration will match that achieved in a traditional temperature chamber. The DAC target value is determined by referencing accumulated DAC target results for one or more prior instances for the specified model and nominal set temperature. These prior results, as will be discussed, are noted at the end of the equilibration period for each session. This then sets a DAC target voltage value to be used as a feed forward element for temperature control.

Process 404 then initiates a temperature change routine based upon the actual set temperature and DAC target value. Process 405 creates a file and appends session temperature data to the file over time, enabling the test temperature to be plotted, for example, via a web page. Process 408 records the final DAC target value when the test system transitions to an equilibrated state. Process 408 also turns on the fans and causes a flow of dry air as well as supplying pressure to inflate and seal the DUT, if necessary.

Process 407 determines when equilibrium is achieved. During that time, process 409 makes certain that a set rate of change of the DAC voltage has not been exceeded and also in conjunction with process 410 adjusts the DAC voltage. If the rate of change has been exceeded, process 413 corrects the voltage level.

The temperature control system operates in two phases; namely, 1) driving to the set temperature, and 2) locking at the set temperature. Before initiating the first phase, the DAC target value is adjusted. The current temperature is read and the delta between the current temperature and the set point is used to offset the DAC target voltage. For instance, if significant heating is required, then it will be advantageous to initially target a DAC value beyond the value indicated by the set temperature.

Process 410 drives to the set temperature. The current temperature is read approximately once per second. This temperature is compared to the set point to determine the temperature error. This error is used to determine whether heating (assume a plus voltage) or cooling (assume a negative voltage) must be applied. Note that while both heating and cooling are discussed herein, either heating or cooling can be used alone. The error is also used to determine whether the power supply voltage (which drives the Peltier devices, in our example) must be ramped high or low. The 0-5V analog input to the power supply is single-ended, controlling only the magnitude of the power supply's output. A digital input to the power supply controls the output voltage polarity if required in order to select between heat and cold. The rate of change to the DAC's output voltage is limited in this embodiment to 3% of full-scale per second to preserve the Peltier devices. The maximum DAC voltage is further limited according to the power supply's polarity and the current temperature to avoid excessive heat gradients across the Peltier devices.

For example, in the heating mode it is desirable to apply increasingly tighter drive voltage limits at higher temperatures since one side of each Peltier device is maintained at the chilled water temperature while the other is exposed to increasing temperatures. While the DAC is ramping, and after it reaches its upper limit, the control program monitors the actual temperature and calculates the rate of change. When the remaining number of seconds projected to reach the set point falls below a threshold, the process begins ramping to the adjusted DAC target value, signaling the beginning of the second phase of the temperature control program.

The temperature control program implements a control loop featuring a DAC feed forward value, whose gain is slowly decreased over time in order to maintain tight control. The feed forward value is represented by the adjusted DAC target value (process 412) which serves to drive the loop into the vicinity of the optimal drive voltage, as shown in FIG. 5 by process 50. If desired, a stabilization temperature window (delta from nominal setpoint where the DUT is considered "close enough" to have stabilized) can be established. In addition, when the DUT is known to have moved from a different position where it had previously equilibrated at the same setpoint, a re-stabilization time can be established. This re-stabilization time allows for better test equipment utilization. This "continuous" monitoring and adjustment can be truly continuous as might be appropriate for an analog system or periodic as might be appropriate for a digital system.

Process 501, in conjunction with process 502, continuously measures the current temperature and determines the temperature error. This error is converted by process 503 to an offset to the adjusted DAC target value. The magnitude of the offset is a function of both the temperature error and the current loop gain and is clamped to limits which are also a function of the loop gain. Over time, the initial offset which was applied to the DAC target value is removed, allowing the DAC target value to drift toward the value indicated at the start. Note that while the parameter for controlling heat (cold) in this embodiment is voltage level, any control parameter, such as frequency, rate of change, pressure, etc., can be used, if desired.

Note that any conditions which result in driving the DAC at a clamp voltage for an extended period will result in a slight correction to the DAC target voltage and a slight increase to the loop gain, which immediately allows wider DAC excursions from the previous target voltage. The DAC target voltage is then adjusted and the loop gain is lowered each time the temperature error trend changes direction after the temperature passes through the zero error region. The loop gain is lowered in this fashion until it reaches a preset minimum.

Processes 504, 505 and 506 work with process 503 to bring the DUT to the set temperature as quickly as possible, followed by a short (less than 10 minutes) period of overshoot and ringing, after which the temperature should not deviate from the set point by more than 0.5 degrees C. After the initial stabilization period, the temperature is typically maintained within +/−0.1 degrees C. For equilibrium to occur, the temperature must remain within certain preset limits for the indicated equilibration period.

Process 507 is available to receive a new set temperature. When such new set temperature is received, the entire process reverts to process 404 (FIG. 4). Since the system is already running, the initial startup tasks are omitted and the temperature control program restarts in its first phase of operation.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A temperature control system comprising:
   a controller for receiving information pertaining to a desired testing temperature for an identified DUT;
   an air supply unit, said air supply unit responding to a first signal for adjusting a temperature level and responding to a second signal voltage polarity for switching between heated and cooled air;
   a chamber adapted for forming around said DUT, said chamber accepting heated or cooled air from said air supply unit;
   at least one sensor for determining the temperature of air in contact with said DUT within said chamber; and
   at least one controller for responding to determined temperatures for adjusting said first and second signals.

2. The system of claim 1 further comprising:
   a cart for holding said DUT during testing; and wherein said chamber is contained on said cart.

3. The system of claim 2 wherein said cart is operable under robotic control to position said DUT for testing.

4. The system of claim 3 wherein said controller is further operable for affecting said robotic control.

5. The system of claim 1 wherein said air supply unit comprises:
   a plurality of voltage sensitive devices for modifying a temperature of said air; and wherein said first signal is a voltage having a magnitude.

6. The system of claim 5 wherein said voltage sensitive devices comprise Peltier devices, and wherein said second signal is a voltage polarity.

* * * * *